(12) United States Patent
Teng et al.

(10) Patent No.: US 10,734,328 B2
(45) Date of Patent: Aug. 4, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Po-Yuan Teng, Hsinchu (TW); Hao-Yi Tsai, Hsinchu (TW); Tin-Hao Kuo, Hsinchu (TW); Ching-Yao Lin, New Taipei (TW); Teng-Yuan Lo, Hsinchu (TW); Chih Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/714,793

(22) Filed: Dec. 16, 2019

(65) Prior Publication Data

US 2020/0118945 A1 Apr. 16, 2020

Related U.S. Application Data

(62) Division of application No. 15/964,087, filed on Apr. 27, 2018, now Pat. No. 10,510,686.

(51) Int. Cl.
*H01L 23/538* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 23/3114* (2013.01); *H01L 23/5383* (2013.01); *H01L 23/5386* (2013.01); *H01L 23/5389* (2013.01); *H01L 24/19* (2013.01);
(Continued)

(58) Field of Classification Search
CPC ... H01L 23/562; H01L 23/5389; H01L 25/50; H01L 24/19; H01L 24/20; H01L 21/565; H01L 21/568; H01L 21/4853; H01L 21/4857; H01L 25/117; H01L 23/5386; H01L 23/5383; H01L 23/3114; H01L 2225/1035; H01L 2225/1058; H01L 2924/351; H01L 2224/214; H01L 2924/19106
USPC ....................................... 257/668
See application file for complete search history.

(56) References Cited

U.S. PATENT DOCUMENTS 10,510,686 B2 * 12/2019 Teng .................. H01L 23/3114

* cited by examiner

*Primary Examiner* — Caleen O Sullivan
(74) *Attorney, Agent, or Firm* — JCIPRNET

(57) ABSTRACT

A semiconductor package includes a first redistribution structure, a semiconductor die disposed on the first redistribution structure, a die attach material disposed between the first redistribution structure and the semiconductor die, and an insulating encapsulant disposed on the first redistribution structure. A first shortest distance from a midpoint of a bottom edge of the semiconductor die to a midpoint of an bottom edge of an extruded region of the die attach material in a width direction of the semiconductor die is greater than a second shortest distance between an endpoint of the bottom edge of the semiconductor die to an endpoint of the bottom edge of the extruded region of the die attach material. The insulating encapsulant encapsulates the semiconductor die and the die attach material. An inclined interface is between the insulating encapsulant and the extruded region of the die attach material.

20 Claims, 12 Drawing Sheets

(51) Int. Cl.
*H01L 21/56* (2006.01)
*H01L 23/00* (2006.01)
*H01L 23/31* (2006.01)
*H01L 25/00* (2006.01)
*H01L 25/11* (2006.01)

(52) U.S. Cl.
CPC ............ *H01L 24/20* (2013.01); *H01L 25/117* (2013.01); *H01L 25/50* (2013.01); *H01L 2224/214* (2013.01); *H01L 2225/1035* (2013.01); *H01L 2225/1058* (2013.01); *H01L 2924/19106* (2013.01); *H01L 2924/351* (2013.01)

SEMICONDUCTOR PACKAGE AND MANUFACTURING METHOD THEREOF

CROSS-REFERENCE TO RELATED APPLICATION

This application is a divisional application of and claims the priority benefit of a prior application Ser. No. 15/964,087, filed on Apr. 27, 2018. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed, in which integrated circuits (ICs) are placed on a carrier having connectors for making connection to the ICs and other electrical components. In an attempt to further increase circuit density, three-dimensional (3D) ICs have also been developed, in which multiple ICs are bonded together electrical connections are formed between the dies and contact pads on a substrate. These relatively new types of packaging for semiconductors face manufacturing challenges such as poor adhesion between the IC and carriers, sidewall chipping, warpage, die shifting, and other reliability issues.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
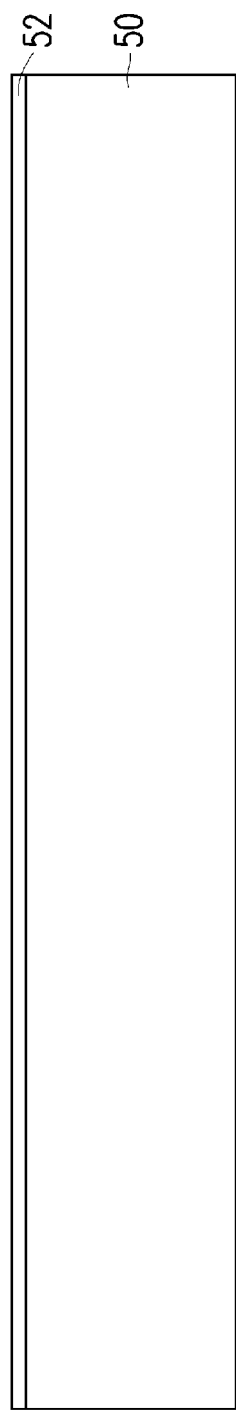
FIG. 1A to FIG. 1K are schematic cross-sectional views of various stages of manufacturing a semiconductor package in accordance with some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
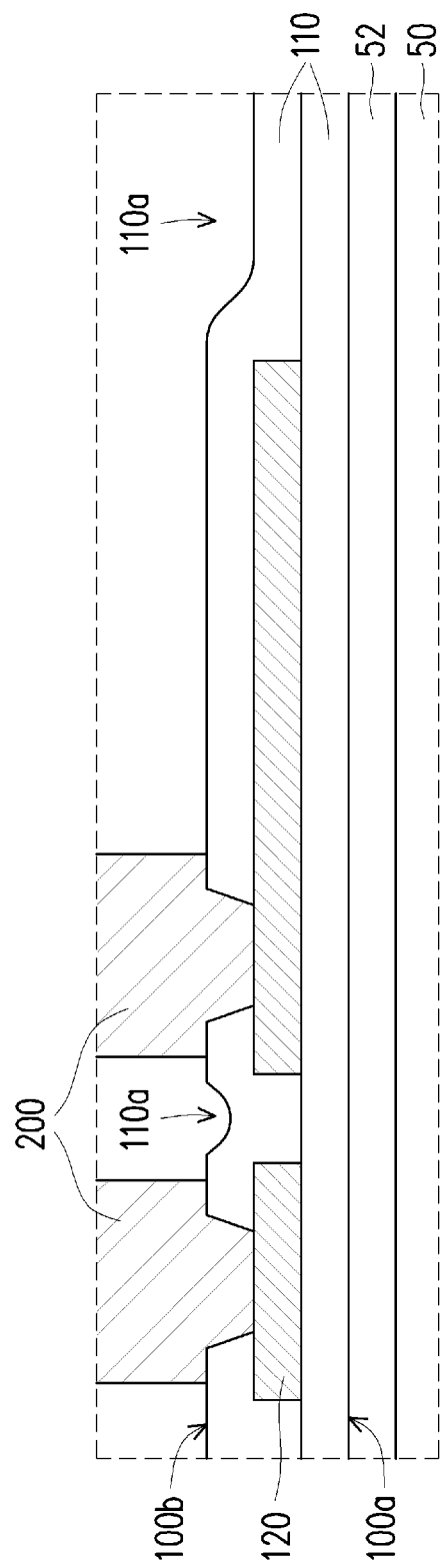
FIG. 2 is a schematic enlarged top view illustrating a part of the structure depicted in FIG. 1C.
Figure 3:
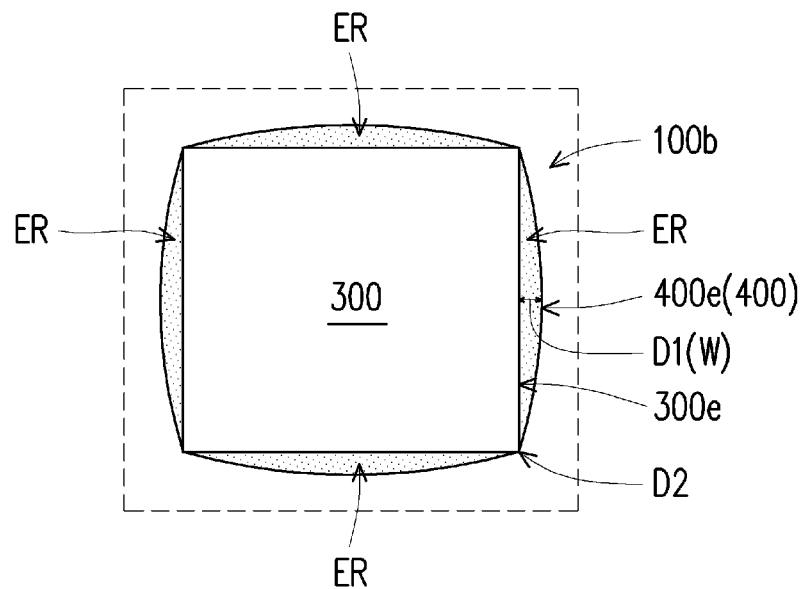
FIG. 3 is a schematic enlarged cross-sectional view illustrating a part of the structure depicted in FIG. 1D.
Figure 4:
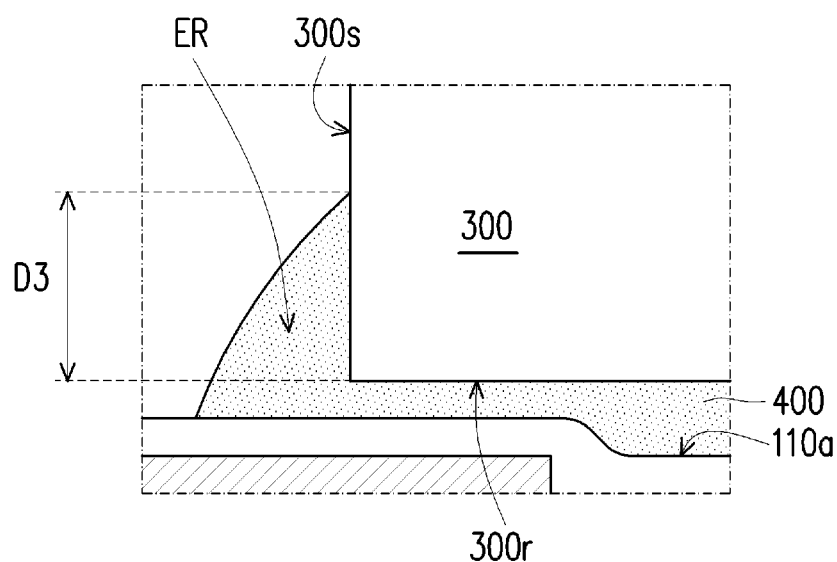
FIG. 4 is a schematic enlarged cross-sectional view illustrating a part of the structure depicted in FIG. 1D.

FIG. 1A to FIG. 1K are schematic cross-sectional views of various stages of manufacturing a semiconductor package in accordance with some exemplary embodiments of the disclosure. FIG. 2 is a schematic enlarged top view illustrating a part of the structure depicted in FIG. 1C, where FIG. 2 shows the enlarged cross-sectional view of the dotted box A indicated in FIG. 1C. FIG. 3 is a schematic enlarged top view illustrating a part of the structure depicted in FIG. 1D, where FIG. 3 shows the enlarged top view of the dotted box B indicated in FIG. 1D. FIG. 4 is a schematic enlarged cross-sectional view illustrating a part of the structure depicted in FIG. 1D, where FIG. 4 shows the enlarged cross-sectional view of the dot-dashed box C indicated in FIG. 1D.

Referring to FIG. 1A, a temporary carrier 50 is provided. In some embodiments, the temporary carrier 50 may include any suitable material that could provide structural support during processing. For example, the temporary carrier 50 includes metal (e.g., steel), glass, ceramic, silicon (e.g., bulk silicon), combinations thereof, multi-layers thereof, or the like. In some embodiments, a release layer 52 may be formed on the temporary carrier 50. The material of the release layer 52 may be any material suitable for bonding and de-bonding the temporary carrier 50 from the structure formed thereon. For example, the release layer 52 includes a layer of light-to-heat-conversion (LTHC) release coating and a layer of associated adhesive (such as a ultra-violet curable adhesive or a heat curable adhesive layer), or the like.

Figure 1B:
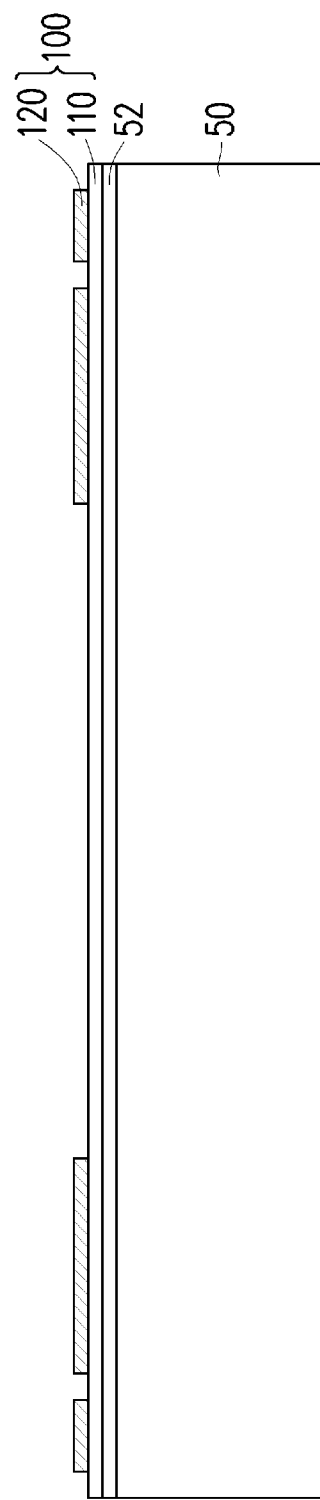
Figure 1C:
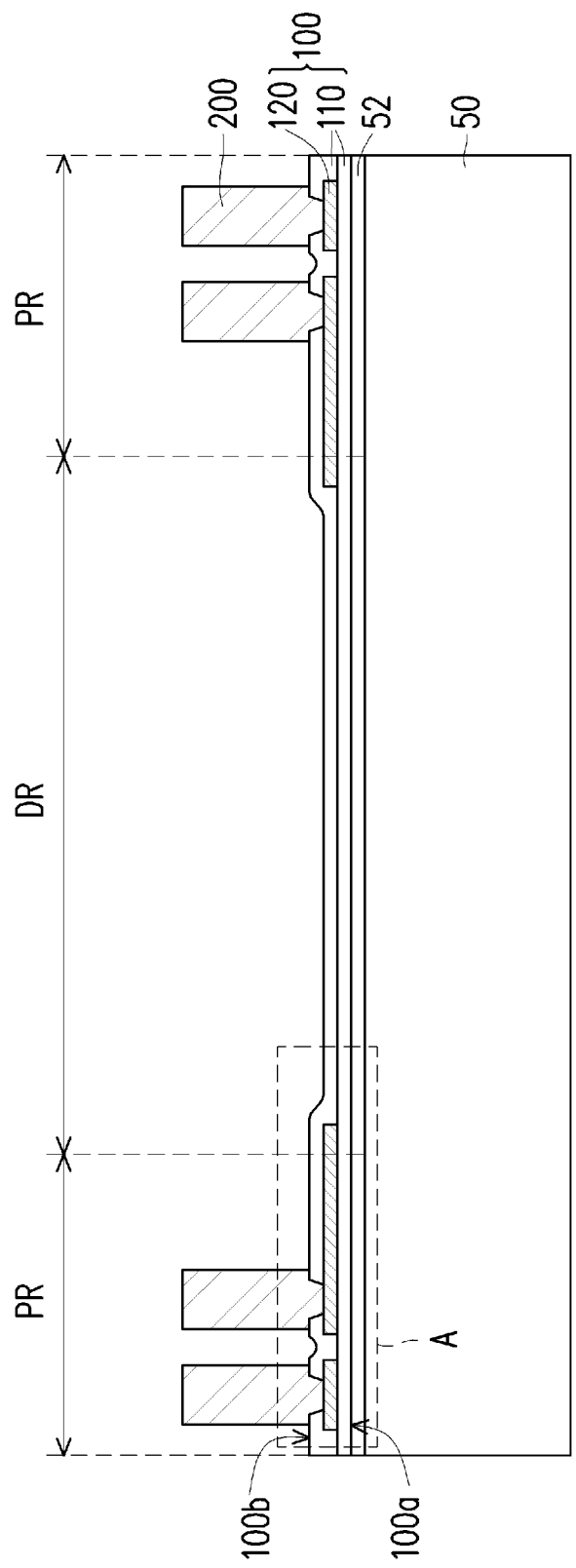

Referring to FIG. 1B and FIG. 1C, a first redistribution structure 100 is formed on the temporary carrier 50 and a conductive connector 200 may be formed on the first redistribution structure 100. The first redistribution structure 100 may include a first dielectric layer 110 and a first patterned conductive layer 120 stacked alternately. In some embodiments, one or more layers of dielectric materials may be represented collectively as the first dielectric layer 110, and conductive features (e.g. conductive lines, conductive pads, and/or conductive vias) are collectively represented as the first patterned conductive layer 120. The first redistribution structure 100 may be referred to as a backside redistribution structure given its placement in the structure.

For example, the first dielectric layer 110 may be formed of any suitable material, such as polybenzoxazole (PBO), polyimide (PI), benzocyclobutene (BCB), or other material that is electrically insulating. According to some embodiments, the first dielectric layer 110 may be formed using any suitable method, such as a spin-on coating process, a deposition process, and the like.

In some embodiments, to facilitate the formation of the first patterned conductive layer 120, a seed layer (not shown) may be first formed on the first dielectric layer 110 using a deposition process, or other suitable method. For example, the seed layer is a conductive layer, which may be a single layer or a composite layer including several sub-layers formed of different materials. In some embodiments, the seed layer includes a titanium layer and a copper layer over the titanium layer and may be formed using a deposition process, or other suitable process. Then, a mask material may be formed and patterned on the seed layer to form a mask pattern (not shown) using a spin coating process, an etching process, or other suitable processes. The mask pattern may include a plurality of openings exposing the underlying seed layer. For example, the material of the mask pattern may include a positive photoresist or a negative phot-resist, but not limited thereto. Next, a conductive material including copper, copper alloy, aluminum, aluminum alloy, or combinations thereof, may be formed in the openings of the mask pattern and on the exposed portions of the seed layer using, for example, a sputtering process, a plating process, or other suitable process. Subsequently, the mask pattern and portions of the seed layer on which the conductive material is not formed may be removed. For example, the mask pattern may be removed using stripping process, or other acceptable removing process. After removing the mask pattern, the exposed portions of the seed layer are removed using, such as wet or dry etching process, or other acceptable removing process. The remaining portions of the seed layer and conductive material form the first patterned conductive layer 120 as shown in FIG. 1B.

In some embodiments, the first redistribution structure 100 includes more than one of the first dielectric layer 110 stacked on the first patterned conductive layer 120. For example, a layer of the dielectric material may be formed over the first patterned conductive layer 120. Then, a portion of the dielectric material may be removed to form the first dielectric layer 110 using, for example, lithography and etching process, or other suitable methods. In other words, the first dielectric layer 110 may include a plurality of openings exposing portions of the first patterned conductive layer 120 for further electrical connection. In some embodiments, the abovementioned steps may be performed multiple times to obtain a multi-layered redistribution structure as required by the circuit design. That is, the numbers of the first dielectric layer 110 and the first patterned conductive layer 120 can be selected based on demand and are not limited in the disclosure. In other embodiments, the first patterned conductive layer 120 may be formed before forming the first dielectric layer 110. It should be noted that the forming sequence of the first dielectric layer 110 and the first patterned conductive layer 120 depends on the design requirement and construe no limitation in the disclosure.

Continued on FIG. 1C, in some embodiments, a conductive material may be formed in the openings of the first dielectric layer 110 to connect the first patterned conductive layer 120 and further protrude on the first dielectric layer 110, thereby forming the conductive connectors 200. The material of the conductive connector 200 may be the same or similar with that of the first patterned conductive layer 120. According to some embodiments, the conductive connectors 200 may be formed by photolithography, plating, photoresist stripping processes, or any other suitable method. For example, the conductive connectors 200 may be formed by forming a mask pattern having openings (not shown), where the mask pattern covers a portion of the first redistribution structure 100 and exposes another portion of the first patterned conductive layer 120 with the openings; forming a metallic material to fill the openings so as to form the conductive connector 200 by electroplating or deposition; and then removing the mask pattern. In certain embodiments, the conductive connectors 200 are through integrated fan-out (InFO) vias.

In some embodiments, the first redistribution structure 100 includes a die attach region DR and a peripheral region PR connected to the die attach region DR. The conductive connectors 200 may be formed in the peripheral region PR of the first redistribution structure 100. The first patterned conductive layer 120 may be formed in the peripheral region PR and/or die attach region DR. In some embodiments, at least a portion of the first patterned conductive layer 120 are formed in the die attach region DR.

The first redistribution structure 100 may have a first surface 100a facing towards the temporary carrier 50 and a second surface 100b opposite to the first surface 100a. Referring to FIG. 1C and FIG. 2, the second surface 100b of the first redistribution structure 100 may be uneven and roughed due to material characteristics and the formation of the first patterned conductive layer 120. In some embodiments, the first redistribution structure 100 may be referred to as a patterned structure. For example, the top surface of the top layer of the first dielectric layer 110 may include concave areas 110a corresponding to the space of the underlying first patterned conductive layer 120, such that the concave areas 110a may cause the second surface 100b to be uneven. That is, the concave areas 110a may be formed between adjacent patterns. In some embodiments, at least a portion of the first patterned conductive layer 120 is formed in the die attach region DR so that the concave areas 110a are introduced in the die attach region DR, thereby causing the second surface 100b in the die attach region DR uneven. As surface roughness is known that provides a measure of the unevenness of the surface height. For example, the average surface roughness of the second surface 100b may be in the range of about 0.1 um to about 1 um. In some embodiments, the surface roughness in the die attach region DR may range from about 1 um to about 15 um due to the underlying patterned conductive layers. It should be appreciated that the illustration of the concave areas 110a is schematic and is not in scale.

Figure 1D:
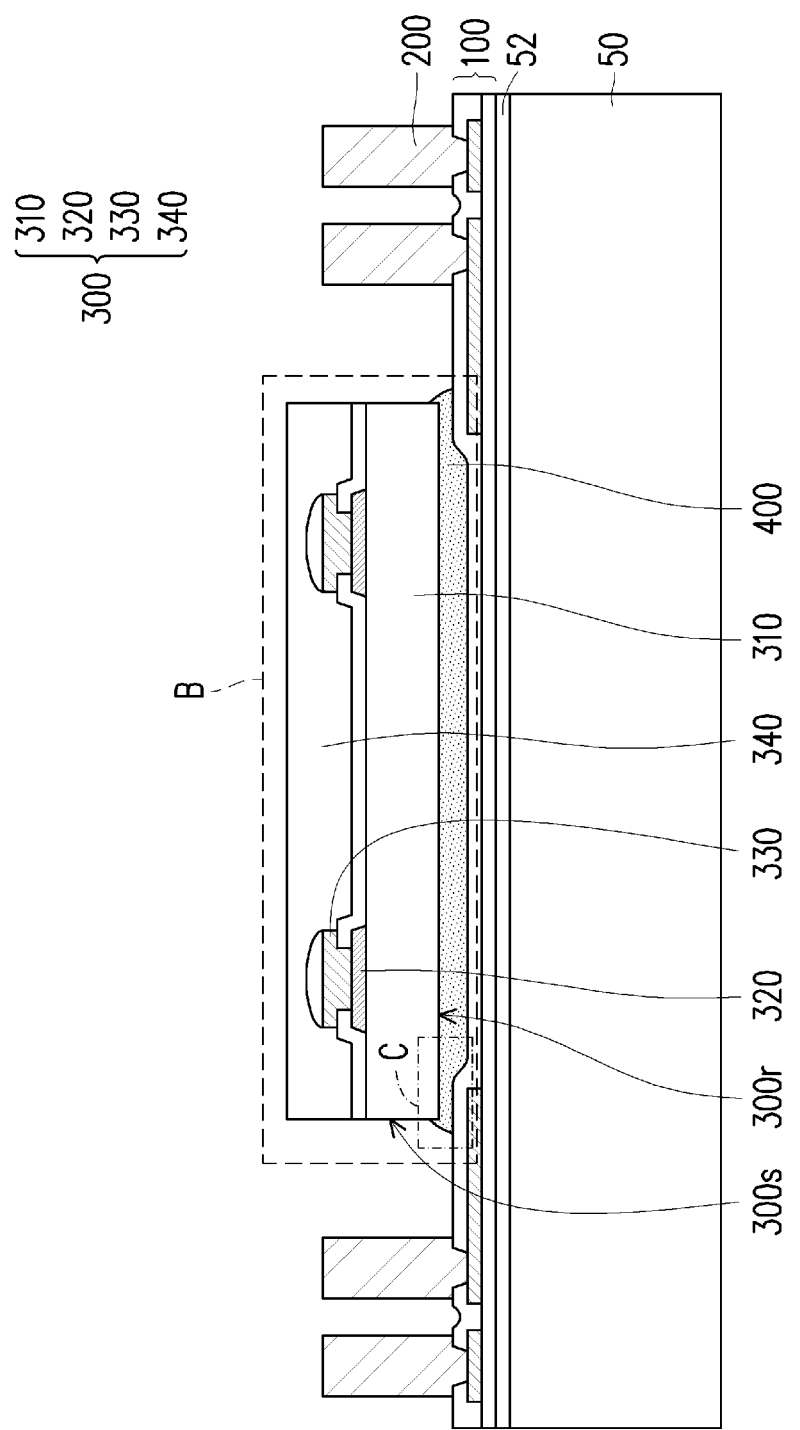

Referring to FIG. 1D, a semiconductor die 300 is provided and disposed on the first redistribution structure 100 using, for example, a pick and place technique, or other suitable method. In some embodiments, the semiconductor die 300 is manufactured through a front end of line (FEOL) process, but is not limited thereto. In some embodiments, the semiconductor die 300 includes a semiconductor substrate 310, a plurality of connecting pads 320, a plurality of connecting pillars 330 and a protection layer 340. In one embodiment, the semiconductor substrate 310 may be a silicon substrate including active components (e.g., diodes, transistors or the like) and passive components (e.g., resistors, capacitors, inductors or the like) formed therein. In one embodiment, the connecting pads 320 may be made of aluminum or alloys thereof, or the like. In some embodiments, the semiconductor die 300 may include an interconnection structure (not shown) disposed between the semiconductor substrate 310 and the connecting pads 320, where the connecting pads 320 physically contact the interconnection structure.

In some embodiments, the connecting pillars 330 are respectively disposed on and electrically connected to the connecting pads 320, where the connecting pillars 330 physically contact the connecting pads 320. In one embodiment, the connecting pillars 330 may include copper pillars, copper alloy pillars, or other suitable metal pillars. In some embodiments, the connecting pillars 330 may include lead-based materials or lead-free materials with or without additional impurity formed on the top, but is not limited thereto. In some embodiments, the protection layer 340 covers the connecting pads 320, and the connecting pillars 330. That is, the protection layer 340 prevents any possible damage(s) occurring on the surfaces of the connecting pillar 330 during the transfer of the semiconductor die 300. In one embodiment, the protection layer 340 may be made of a polybenzoxazole (PBO) layer, a polyimide (PI) layer, or suitable polymers or inorganic materials. In some embodiments, the protection layer 340 may further act as a passivation layer for providing better planarization and evenness. The numbers of the connecting pads 320 and the connecting pillars 330 can be selected based on demand and are not limited in the disclosure. It should be appreciated that the illustration of the semiconductor die 300 and other components throughout all figures is schematic and is not in scale.

For example, the semiconductor die 300 may include digital die, analog die or mixed signal die, such as application-specific integrated circuit (ASIC) die, logic die, sensor die, but is not limited thereto. Note that, as shown in FIG. 1D, only one semiconductor die 300 is presented for illustrative purposes; however, it should be noted that the number of the semiconductor die can be one or more than one, the disclosure is not limited thereto. In certain embodiments, additional semiconductor die(s) may be provided, and the additional semiconductor die(s) and the semiconductor die 300 may be the same type or different types.

The semiconductor die 300 includes a rear surface 300r, a sidewall 300s connected to the rear surface 300r, and a bottom edge 300e (illustrated in FIG. 2) is between the rear surface 300r and the sidewall 300s. Continued on FIG. 1D, a rear surface 300r of the semiconductor die 300 is attached to the first redistribution structure 100 through a die attach material 400. In some embodiments, the die attach material 400 may function as an adhesive mechanism to adhere the semiconductor die 300 to the first redistribution structure 100. For example, the die attach material 400 may be attached to the rear surface 300r of the semiconductor die 300 before placing the semiconductor die 300 on the first redistribution structure 100. In some embodiments, before placing the semiconductor die 300 on the first redistribution structure 100, the die attach material 400 on the rear surface 300r of the semiconductor die 300 may include a thickness ranging about 10 um to about 40 um. The die attach material 400 may have a similar dimension and/or shape to the semiconductor die 300. Alternatively, the die attach material 400 may include other dimensions and shapes. In some embodiments, the die attach material 400 include a polymer, thermoplastic material (e.g. epoxy resin, phenol resin, etc.), or the like that functions as an adhesive. For example, the die attach material 400 may be a die attached film (DAF), an adhesive bonding film (ABF), or the like. Other suitable adhesive materials compatible with semiconductor processing environments may be utilized. The die attach material 400 may be a single film or a multi-layered film, but is not limited thereto. In some embodiments, the die attach material 400 may include pressure sensitive material and/or radiation sensitive material. For example, the die attach material 400 may become semi-liquid when subjecting a pressure and/or a heat, and may become sticky to function as an adhesive at elevated pressures and/or temperatures.

For example, during attaching the semiconductor die 300, the semiconductor die 300 is pressed so that the die attach material 400 is extruded laterally out of the rear surface 300r of the semiconductor die 300 and climbs upwardly to cover a sidewall 300s of the semiconductor die 300. In some embodiments, a process of applying a temperature to the die attach material 400 in the range of about 80° C. to about 200° C. is performed while the semiconductor die 300 is placed on the first redistribution structure 100 for a duration ranging from about 1 second to about 3 seconds. In some embodiments, the heating operation may be followed after the semiconductor die placement. During the heating operation, the die attach material 400 may be softened. For example, the die attach material 400 may be exposed to UV radiation and/or heating to elevated temperatures so as to soften and/or activate the adhesive properties of the die attach material 400. In some embodiments, the time taken for applying the temperature (e.g., from about 140° C. to about 200° C.) may range from 1 second to 3 seconds approximately. In some embodiments, during attaching the semiconductor die 300, a process of applying a pressure to the die attach material 400 in the range of about 0.5 MPA to about 3 MPA is performed for the duration ranging from 1 second to 3 seconds approximately. In some embodiments, a force exerted on the semiconductor die 300 is increased in order to enhance the adhesion between the semiconductor die 300 and the first redistribution structure 100. The elevated pressures and the elevated temperatures can be applied to the die attach material 400 during the same process or applying separately, the disclosure is not limited thereto.

When the die attach material 400 is returned to normal temperature and pressure, the die attach material 400 may return to a solid state and the semiconductor die 300 can be securely adhered and positioned in the die attach region DR of the first redistribution structure 100. In some embodiments, after attaching, the die attach material 400 may follow the contour of the surface topography of the second surface 100b of the first redistribution structure 100. For example, the processed die attach material 400 may fill the concave areas 110a on the second surface 100b of the first redistribution structure 100. The presence of voids may create weak spots on reliability test and cause the semiconductor die loosely attached. After processing to the die attach material 400, the voids in the die attach material 400 may be substantially eliminated, thereby improving the reliability and adhesion between the semiconductor die 300 and the first redistribution structure 100. In some embodiments, after processing to the die attach material 400, the interfacial adhesion between the die attach material 400 and the second surface 100b of the first redistribution structure 100 may be improved by approximately 10% to 50%.

Referring to FIG. 1D, FIG. 3 and FIG. 4, in some embodiments, after attaching the semiconductor die 300, the die attach material 400 includes an extruded region ER surrounding the semiconductor die 300. For example, the extruded region ER of the die attach material 400 may be the portion of the die attach material 400 which is not covered by the rear surface 300r of the semiconductor die 300. In some embodiments, a first shortest distance D1 from a midpoint of an bottom edge 300e of the rear surface 300r of the semiconductor die 300 to a midpoint of an bottom edge 400e of the extruded region ER of the die attach material 400 in a width direction of the semiconductor die 300 is greater than a second shortest distance D2 between an endpoint of the bottom edge 300e of the rear surface 300r of the semiconductor die 300 to an endpoint of the bottom edge 400e of the extruded region ER of the die attach material 400. In some embodiments, as the top plan view shown in FIG. 3, the boundary line of the die attach material 400 may intersect with the boundary line of the semiconductor die 300. For example, the boundary line of the die attach material 400 may intersect with the boundary line of at the vertices of the semiconductor die 300 or the edges close to the vertices of the semiconductor die 300. In other words, a small amount of the die attach material 400 is extruded out at the corners of the semiconductor die 300 such that the corner edge of the semiconductor die 300 may be slightly covered or may not be covered by the die attach material 400.

In some embodiments, a width W of the extruded region ER of the die attach material 400 decreases from the midpoint of the bottom edge 400e of the extruded region ER to the endpoint of the bottom edge 400e of the extruded region ER. In some embodiments, the width W of the extruded region ER may gradually decrease from the midpoint of the bottom edge 400e of the extruded region ER towards the both endpoints of the bottom edge 400e of the extruded region ER. The width W (e.g., extruded amount of the die attach material 400) can be controlled by, for example, selecting suitable constituents and/or thickness of the die attach material 400, adjusting the processing conditions (e.g., pressure, temperature and duration), and the like. In some embodiments, the width W of the extruded region ER of the die attach material 400 may range from about 5 um to about 200 um. In some embodiments, as shown in FIG. 4, after attaching the semiconductor die 300, a covered distance D3 of the sidewall 300s of the semiconductor die 300 covered by the extruded region ER of the die attach material 400 may range from about 5 um to about 200 um.

Figure 1E:
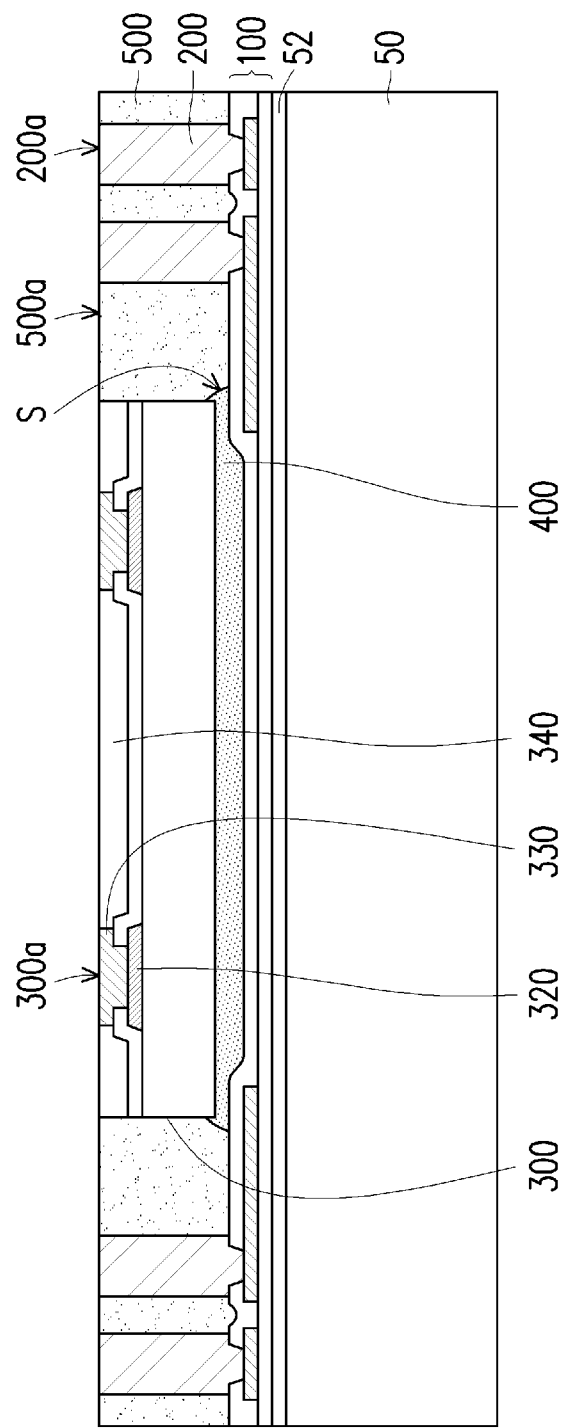

Referring to FIG. 1E, an insulating encapsulant 500 is formed on the first redistribution structure 100 to encapsulate the semiconductor die 100 and the die attach material 400. For example, the insulating encapsulant 500 may be formed by an over-molding process followed by a planarizing process. For example, the formation of the insulating encapsulant 500 may include forming an insulating material (not shown) by over-molding to encapsulate the conductive connectors 200, the semiconductor die 300 and the die attach material 400, and then planarizing insulating material, the conductive connectors 200, and the semiconductor die 300 until the top surfaces of the connecting pillars 330 and the protection layer 340 of the semiconductor die 300 and the top surfaces 200a of the conductive connectors 200 being exposed by the planarized insulating material to form the insulating encapsulant 500.

That is, after the planarizing process, the protection layer 340 of the semiconductor die 300 is partially removed to expose the connecting pillars 330 of the semiconductor die 300, and the insulating material is partially removed to expose the top surfaces 200a of the conductive connectors 200, and the top surfaces of the connecting pillars 330 and the protection layer 340. In other words, as shown in FIG. 1E, the top surfaces 200a of the conductive connectors 200, the connecting pillars 330 and the protection layer 340 are exposed by the top surface 500a of the insulating encapsulant 500. The top surfaces of the connecting pillars 330 and the protection layer 340 may be referred to as an active surface 300a of the semiconductor die 300. In certain embodiments, after the planarization, the top surface 500a of the insulating encapsulant 500, the top surfaces 200a of the conductive connectors 200, and the active surface 300a of the semiconductor die 300 become substantially levelled with and coplanar to each other.

In other embodiments, the conductive connectors 200 may be formed after forming the insulating material. For example, after forming the first redistribution structure 100, then the semiconductor die 300 may be disposed and attached on the first redistribution structure 100. Next, the insulating material is formed on the first redistribution structure 100 to encapsulate the semiconductor die 300 and the die attach material 400. Subsequently, a drilling process (e.g., a laser drilling, a mechanical drilling, or other suitable process) may be performed on the insulating material to form holes in the insulating material. Next, the conductive material may be filled in the holes of the insulating material. In some embodiments, the insulating material and the conductive material may be planarized such that the insulating encapsulant 500 and the conductive connectors 200 are formed. In some embodiments, the conductive connectors 200 may be referred to as through insulating vias (TIVs).

In some embodiments, after forming the insulating encapsulant 500, an inclined interface S is formed between the insulating encapsulant 500 and the die attach material 400. The inclined interface S may be coplanar with the surface of the extruded region ER. As the cross-sectional view depicted in FIG. 1E, the inclined interface S may be nonlinear. For example, the inclined interface S may be a convex-upward surface relative to the first redistribution structure 100 in the cross section. In some embodiments, the curve which the inclined interface S intersects with the cross-section plane may be substantially concave down toward the first redistribution structure 100 as depicted in FIG. 1E. In other embodiments, the inclined interface S may be linear, but is not limited thereto. Due to the presence of the extruded region ER of the die attach material 400, the maximum stress on the first redistribution structure 100 may shift from the semiconductor die 300 side to the insulating encapsulant 500 side, thereby protecting the semiconductor die 300 from being subjecting to excessive compressive stress (e.g., caused by CTE mismatch).

Figure 1F:
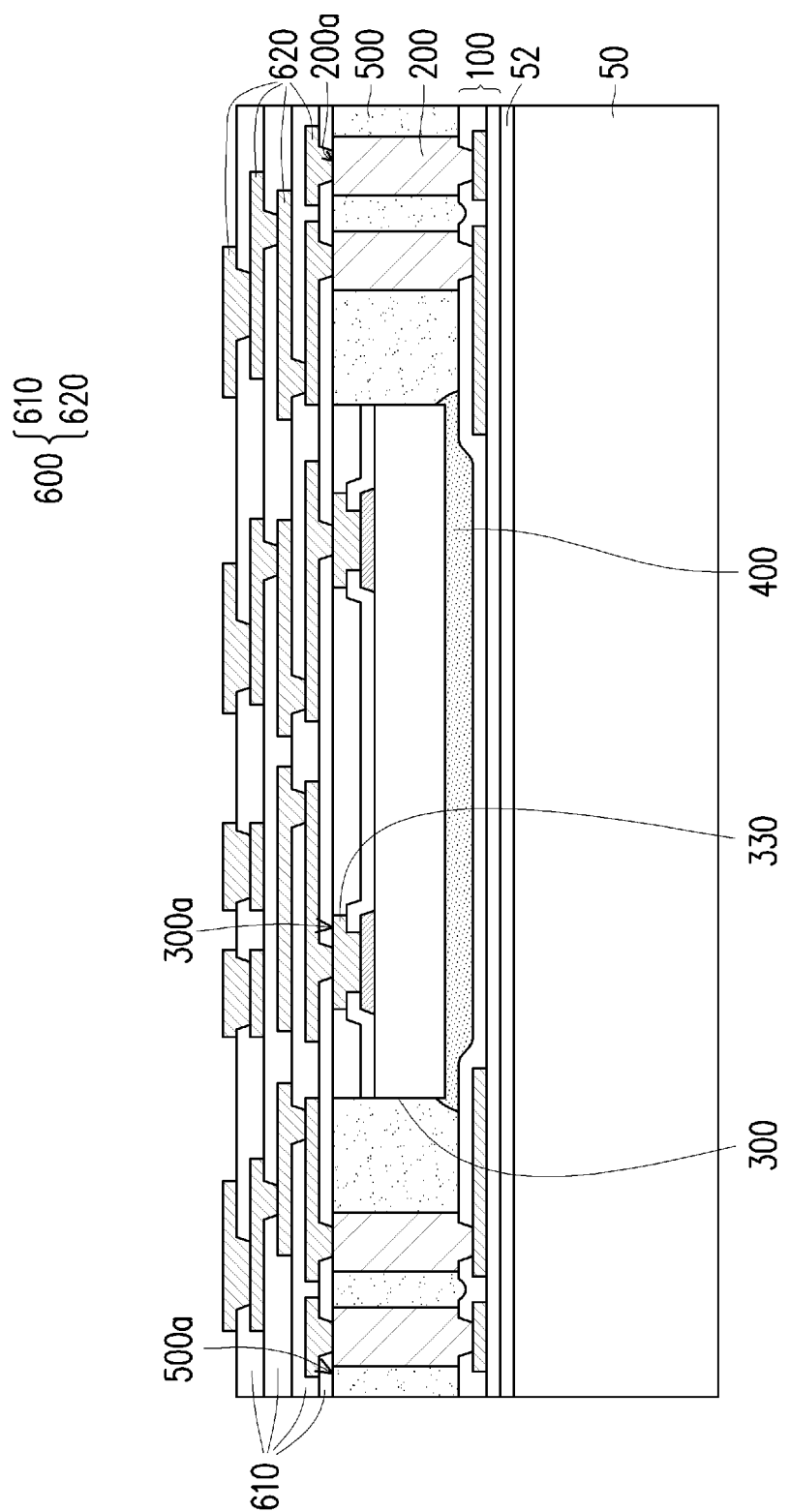

Referring to FIG. 1F, a second redistribution structure 600 is formed on the insulating encapsulant 500. For example, the second redistribution structure 600 may include a second dielectric layer 610 and a second patterned conductive layer 620 sequentially formed on the insulating encapsulant 500, where the second patterned conductive layer 620 is connected to the conductive connectors 200 and the connecting pillars 330 of the semiconductor die 300. In some embodiments, the second patterned conductive layer 620 is electrically connected to the first redistribution structure 100 through the conductive connectors 200.

In some embodiments, the second dielectric layer 620 is formed by forming a dielectric material (not shown) on the active surface 300a of the semiconductor die 300, the top surfaces 200a of the conductive connectors 200 and the top surface 500a of the insulating encapsulant 500, and patterning the dielectric material to form a plurality of openings (not marked) exposing the top surfaces 200a of the conductive connectors 200 and portions of the active surface 300a of the semiconductor die 300 (e.g., the top surfaces of the connecting pillars 330). Then, the second patterned conductive layer 620 is formed by forming a conductive material (not shown) on the second dielectric layer 610, where the conductive material filling into the openings formed in the second dielectric layer 610 to physically contact the top surfaces 200a of the conductive connectors 200 and the top surface of the connecting pillars 330 of the semiconductor die 300. Subsequently, patterning the conductive material to form the second patterned conductive layer 620. It should be noted that the forming sequence of the second dielectric layer 610 and the second patterned conductive layer 620 depends on the design requirement and construe no limitation in the disclosure. Due to the configuration of the second dielectric layer 610 and the second patterned conductive layer 620, a routing function is provided to the package structure such that of the second redistribution structure 600 is referred as a front side redistribution structure. In certain embodiments, as the underlying insulating encapsulant 500 provides better planarization and evenness, the later-formed second redistribution structure 600 can be formed with uniform line-widths or even profiles, resulting in improved line/wiring reliability.

The formation of the second redistribution structure 600 includes sequentially forming one or more second dielectric layers 610 and one or more layers of second patterned conductive layers 620 in alternation. In certain embodiments, the second patterned conductive layers 620 are sandwiched between the second dielectric layers 610, where the top surface of the topmost layer of the second patterned conductive layers 620 is exposed by a topmost layer of the second dielectric layers 610, and a bottom surface of the lowest layer of the second patterned conductive layers 620 is exposed by the lowest layer of the second dielectric layers 610. In one embodiment, the top surface of the topmost layer of the second patterned conductive layers 620 exposed by a topmost layer of the second dielectric layers 610 may be connected to a later-formed component(s), and the bottom surface of the lowest layer of the second patterned conductive layers 620 exposed by the lowest layer of the second dielectric layers 610 is connected to an underlying component (e.g. the semiconductor die 300 and the conductive connectors 200).

The material and the forming process of the second redistribution structure 600 may be similar with that of the first redistribution structure 100, and the detailed descriptions are omitted for simplification. In some embodiments, as shown in FIG. 3, the second redistribution structure 600 includes more than one dielectric layers 610 and multiple second patterned conductive layers 620 stacked alternately; however, the disclosure is not limited thereto. The numbers of the second dielectric layer 610 and the second patterned conductive layer 620 is not limited in this disclosure.

In some other embodiments, a plurality of pads (not marked) may be formed on some of the top surface of the topmost layer of the second patterned conductive layer 620 for electrically connecting with the later-formed components. For example, the above-mentioned pads include under-ball metallurgy (UBM) patterns for ball mount and/or connection pads for mounting of electronic components. In one embodiment, the material of the pads may include copper, nickel, titanium, tungsten, or alloys thereof or the like, and may be formed by an electroplating process. The shape and number of the pads is not limited in this disclosure.

Figure 1G:
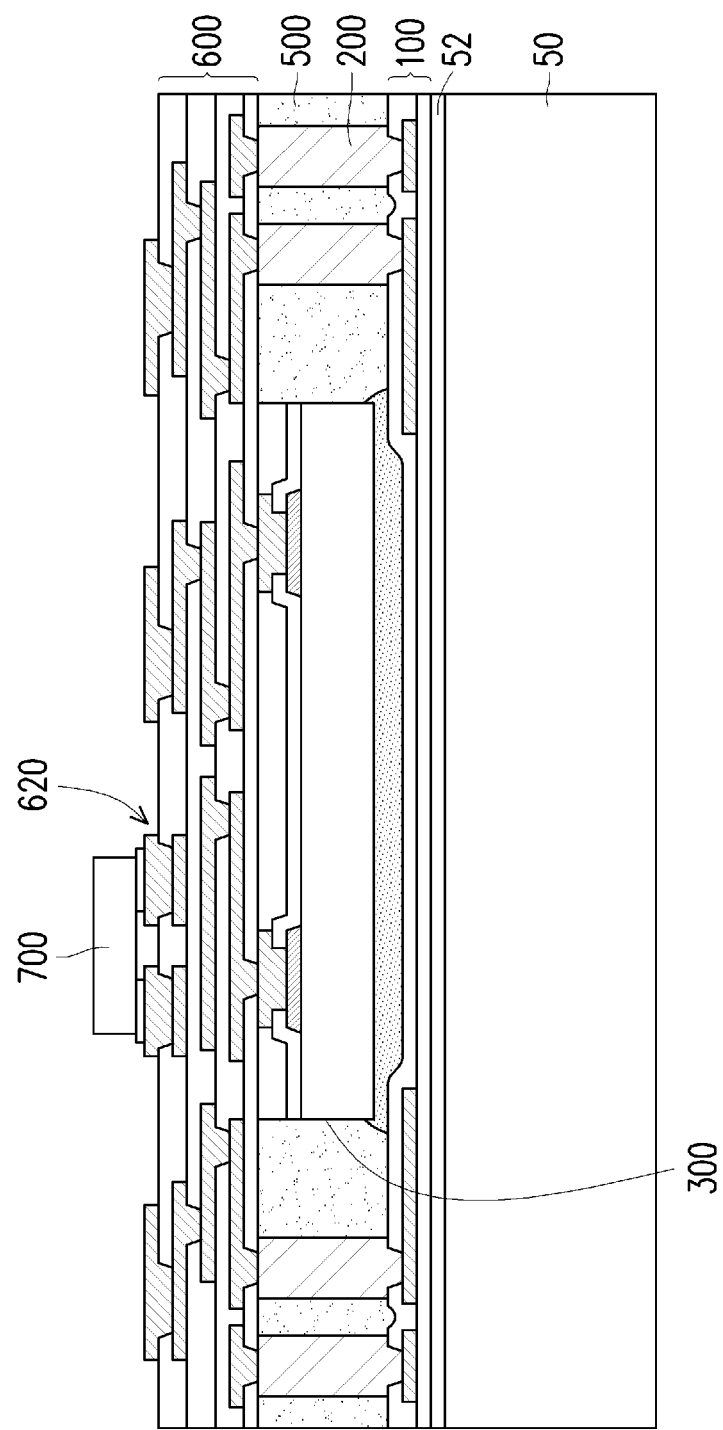

Referring to FIG. 1G, an electronic component 700 may be optionally disposed on the second redistribution structure 600 to generate the desired functional requirements. In some embodiments, the electronic component 700 includes a surface mount component, integrated passive component (e.g., resistors, capacitors, or the like), or the like.

Figure 1H:
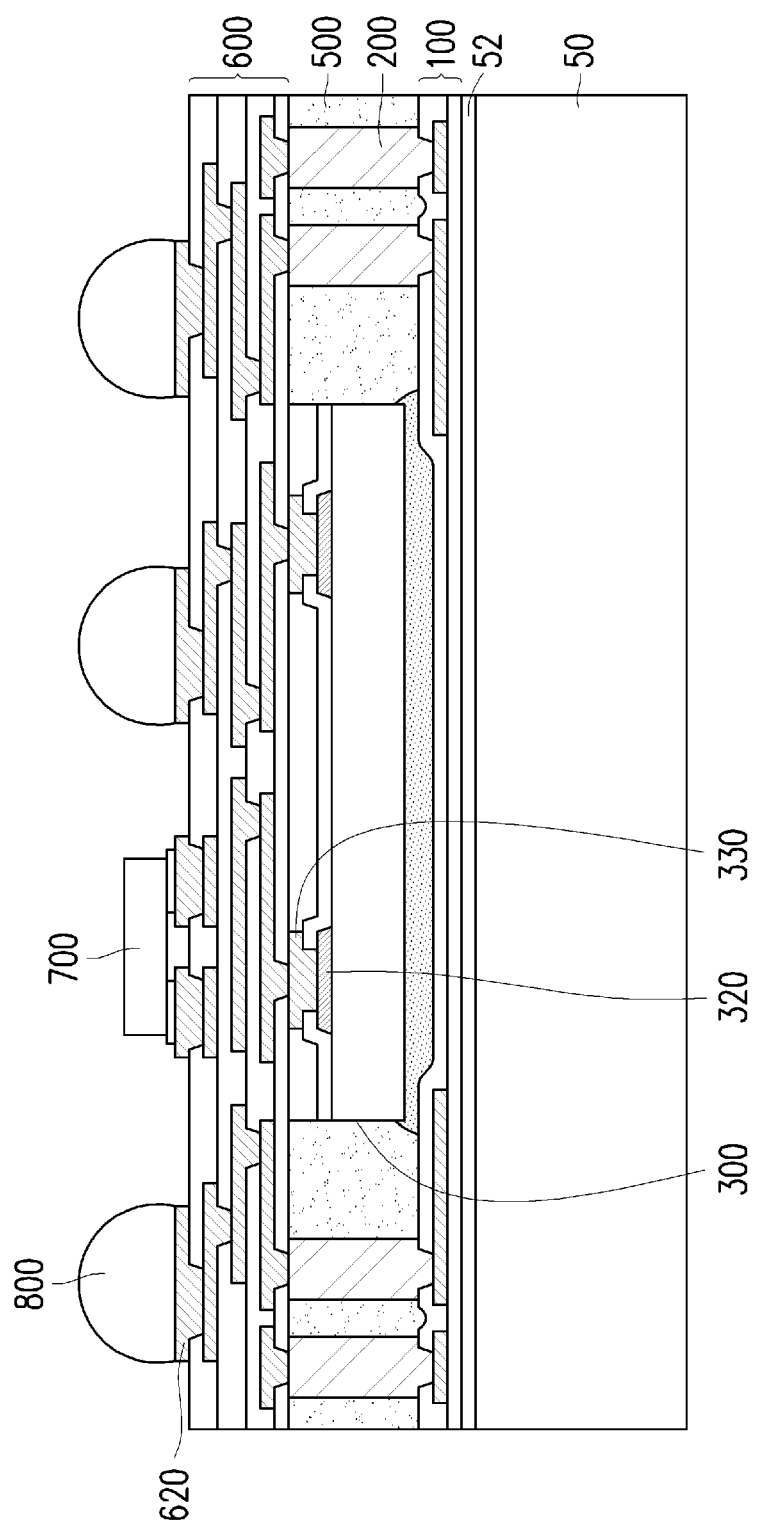

Referring to FIG. 1H, a conductive terminal 800 may be formed on the second redistribution structure 600 for external electrical connection. In some embodiments, the conductive terminals 800 may be disposed on the second patterned conductive layer 620 of the second redistribution structure 600 by a ball placement process, a plating process, or other suitable processes. For example, the conductive terminals 800 include solder balls, ball grid array (BGA) balls, or other terminals, but is not limited thereto. Other possible forms and shapes of the conductive terminals 800 may be utilized according to the design requirement. In some embodiments, a soldering process and a reflow process may be optionally performed for enhancement of the adhesion between the conductive terminals 800 and the second redistribution structure 600.

Figure 1I:
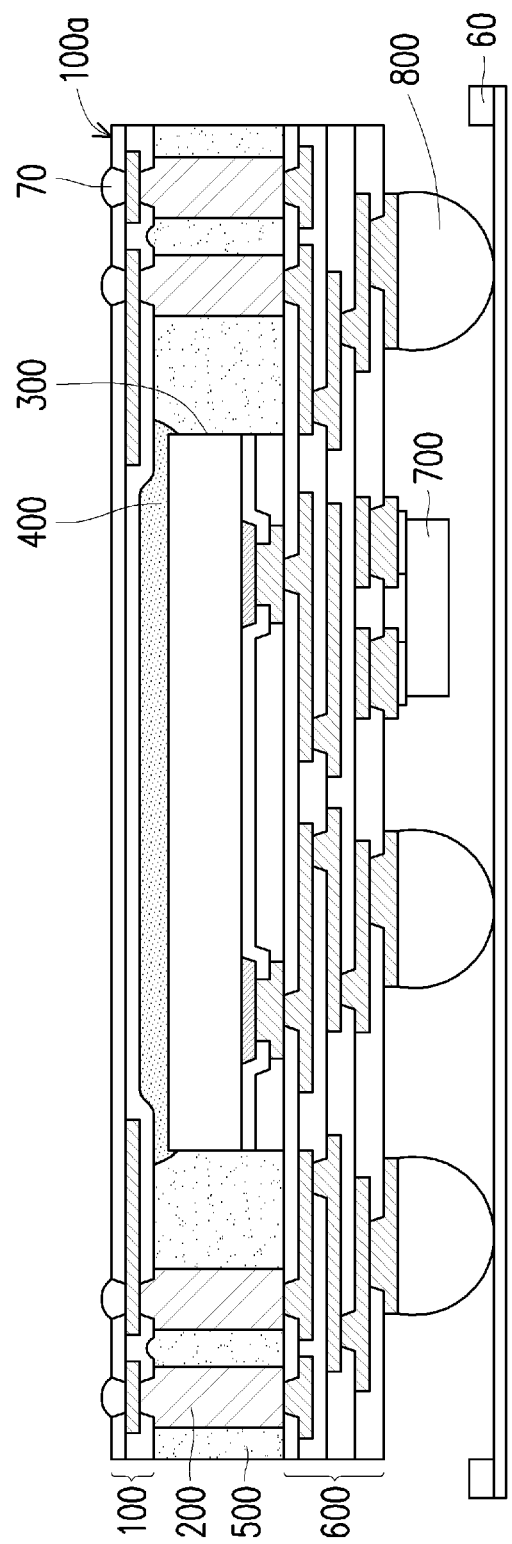

Referring to FIG. 1I, a plurality of conductive joints 70 is formed on the first redistribution structure 100 opposite to the insulating encapsulant 500. In some embodiments, after forming the electronic component 700 and the conductive terminals 800, the temporary carrier 50 and the release layer 52 are removed to expose the first surface 100a of the first redistribution structure 100. For example, the temporary carrier 50 is detached from the first redistribution structure 100 through a de-bonding process. In some embodiments, the external energy such as UV laser, visible light or heat, may be applied to the release layer 52 so that the first redistribution structure 100 and the temporary carrier 50 can be separated. Subsequently, the structure may be flipped (turned upside down) and placed on a holder 60 for subsequent processes formed on the first surface 100a of the first redistribution structure 100 as shown in FIG. 1I.

After removing the temporary carrier 50 and the release layer 52, forming a plurality of openings (not marked) on the first surface 100a of the first redistribution structure 100. For example, the first dielectric layer 110 is patterned to form openings exposing at least a portion of the first patterned conductive layer 120 using, for example, an etching process, a laser drilling process, or other suitable process. Next, the conductive joints 70 may be formed or dispensed in the openings of the first dielectric layer 110. In some embodiments, the conductive joints 70 are made of solder materials (e.g., solder paste or the like). In some embodiments, the conductive joints may be referred to as solder joints.

Figure 1J:
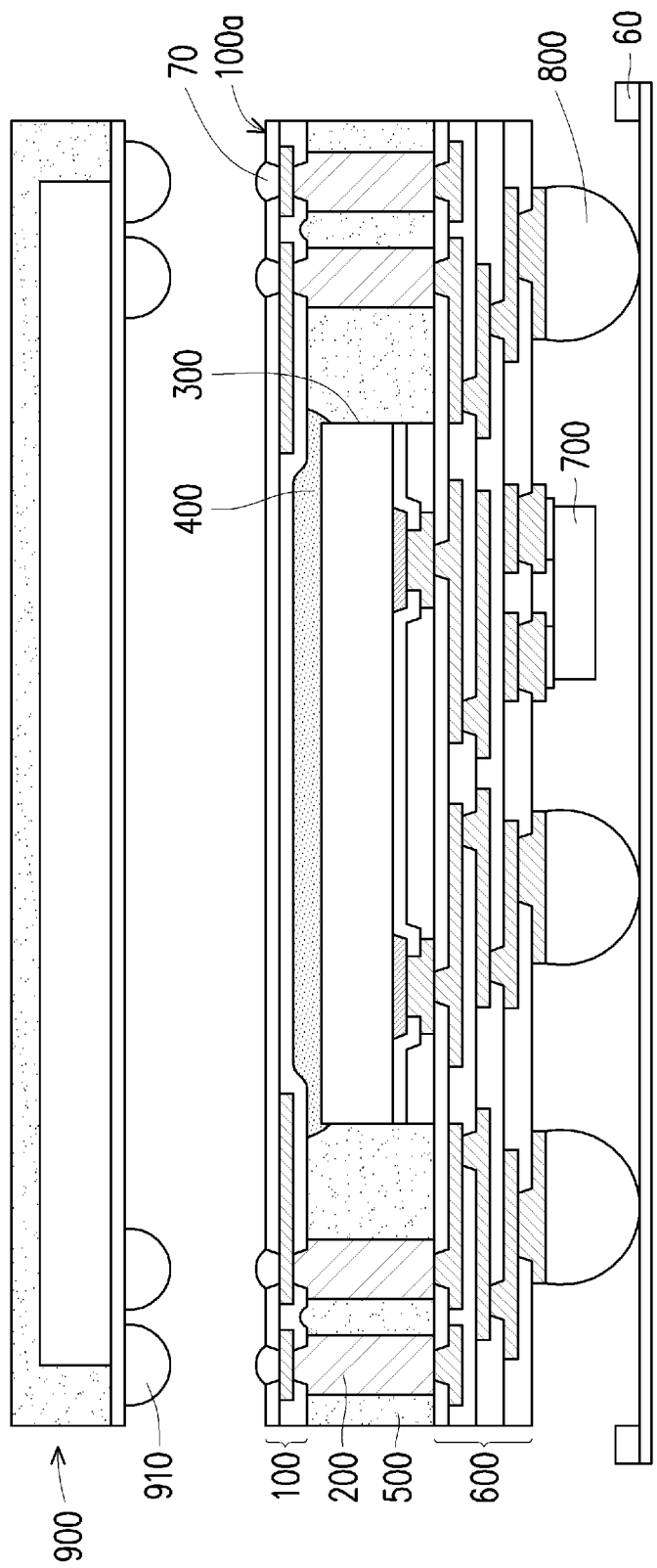
Figure 1K:
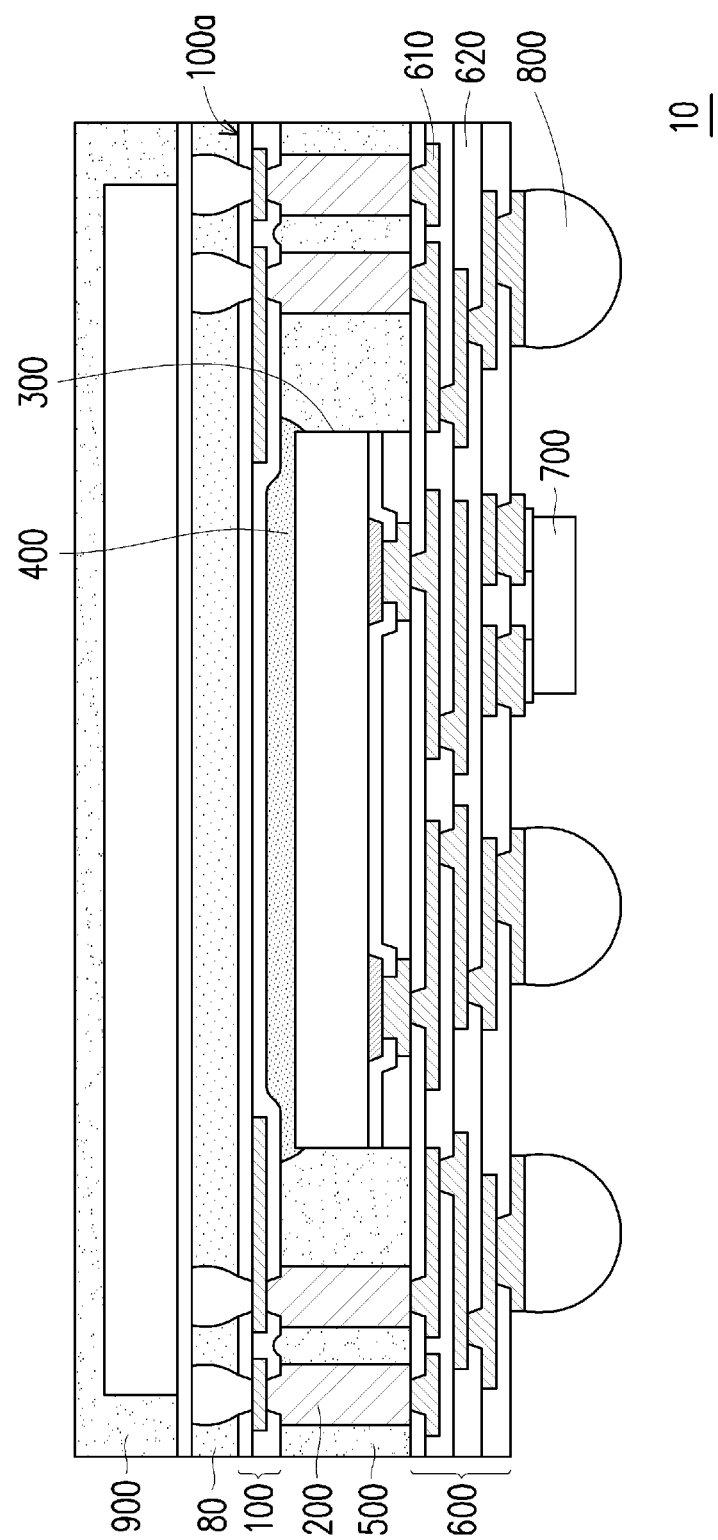

Referring to FIG. 1J and FIG. 1K, a semiconductor device 900 is provided and may be disposed on the first redistribution structure 100 opposite to the insulating encapsulant 500. In some embodiments, through the first redistribution structure 100, the conductive connectors 200 and the second redistribution structure 600, the semiconductor device 900 is electrically connected to the semiconductor die 300.

In some embodiments, the semiconductor device 900 may be bonded to the first redistribution structure 100 with the conductive joints 70 therebetween through flip chip bonding technology and/or surface mount technology. The disclosure is not limited thereto. For example, the semiconductor device 900 may include digital chips, analog chips or mixed signal chips, such as application-specific integrated circuit (ASIC) chips, sensor chips, wireless and radio frequency (RF) chips, MEMS chips, CIS chips, pre-assembled packages, memory chips, logic chips or voltage regulator chips. The disclosure is not limited thereto. For example, the semiconductor device 900 may include terminals 910. The terminals 910 may be disposed and/or positioned on the conductive joints 70. In some embodiments, a subsequent bonding process may be performed to bond the conductive joints 70 and terminals 910 of the semiconductor device 900. For example, a reflow process may be performed such that a portion of the terminals 910 and/or the conductive joints 70 may melt during the reflow process and form at least portions of the solder regions between the terminals 910 and the first redistribution structure 100. Other suitable methods may be utilized to attach the semiconductor device 900 onto the first redistribution structure 100. The disclosure is not limited thereto.

Continued on FIG. 1K, an underfill material 80 may be formed between the semiconductor device 900 and the first surface 100a of the first redistribution structure 100 using, for example, a dispensing process, or other suitable method. In some embodiments, the underfill material 80 at least fills the gaps between the conductive joints 80 and between the first redistribution structure 100, the semiconductor device 900 to provide structural support and protection to the terminals 910 of the semiconductor device 900. In some embodiments, the underfill material 80 may be a molding compound including polymer material (e.g., epoxy, resin, and the like) either with or without fillers (e.g., silica filler, glass filler, and the like), adhesion promoters, combinations thereof, and the like.

After forming the underfill material 80, the conductive terminals 800 may be released from the holder 60 to form a semiconductor package 10. For example, a dicing process is performed to form a plurality of the semiconductor packages 10 into individual and separated semiconductor packages 10. In one embodiment, the dicing process is wafer dicing process including mechanical blade sawing, laser cutting, or other suitable method. In some embodiments, the semiconductor package 10 is placed in the tray and ready to package out. Up to here, the manufacture of the semiconductor package 10 is completed.

According to some embodiments, a manufacturing method of a semiconductor package is provided with the following steps: attaching a rear surface of a semiconductor die on a first redistribution structure by a die attach material, where during attaching the semiconductor die, the semiconductor die is pressed so that the die attach material is extruded laterally out of the rear surface of the semiconductor die and climbs upwardly to cover a sidewall of the semiconductor die, and after attaching the semiconductor die, the die attach material comprises an extruded region surrounding the semiconductor die, a first shortest distance from a midpoint of an bottom edge of the rear surface of the semiconductor die to a midpoint of an bottom edge of the extruded region of the die attach material in a width direction of the semiconductor die is greater than a second shortest distance between an endpoint of the bottom edge of the rear surface of the semiconductor die to an endpoint of the bottom edge of the extruded region of the die attach material; and forming an insulating encapsulant on the first redistribution structure to encapsulate the semiconductor die and the die attach material.

According to some embodiments, a manufacturing method of a semiconductor package is provided with the following steps: providing a semiconductor die with a die attach material; placing the semiconductor die on a patterned structure, where the die attach material is between the semiconductor die and the patterned structure and in contact with a roughed surface of the patterned structure, and a surface roughness of the roughed surface ranges from about 1 um to about 15 um; subjecting the die attach material to a pressure and a temperature; and forming an insulating encapsulant on the patterned structure to encapsulate the semiconductor die and the die attach material.

According to some embodiments, a semiconductor package includes a first redistribution structure, a semiconductor die, a die attach material and an insulating encapsulant. The semiconductor die is disposed on the first redistribution structure and includes a rear surface, a sidewall connected to the rear surface and a bottom edge between the rear surface and the sidewall. The die attach material is disposed between the first redistribution structure and the semiconductor die and includes an extruded region, where a first shortest distance from a midpoint of the bottom edge of the semiconductor die to a midpoint of an bottom edge of the extruded region of the die attach material in a width direction of the semiconductor die is greater than a second shortest distance between an endpoint of the bottom edge of the semiconductor die to an endpoint of the bottom edge of the extruded region of the die attach material. The insulating encapsulant is disposed on the first redistribution structure and encapsulates the semiconductor die and the die attach material, where an inclined interface is between the insulating encapsulant and the extruded region of the die attach material.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
   a first redistribution structure;
   a semiconductor die, disposed on the first redistribution structure and comprising a rear surface, a sidewall connected to the rear surface, and a bottom edge between the rear surface and the sidewall;
   a die attach material, disposed between the first redistribution structure and the semiconductor die and comprising an extruded region, wherein a first shortest distance from a midpoint of the bottom edge of the semiconductor die to a midpoint of an bottom edge of the extruded region of the die attach material in a width direction of the semiconductor die is greater than a second shortest distance between an endpoint of the bottom edge of the semiconductor die to an endpoint of the bottom edge of the extruded region of the die attach material; and
   an insulating encapsulant, disposed on the first redistribution structure and encapsulating the semiconductor die and the die attach material, wherein an inclined interface is between the insulating encapsulant and the extruded region of the die attach material.

2. The semiconductor package according to claim 1, wherein a width of the extruded region of the die attach material decreases from the midpoint of the bottom edge of the extruded region to the endpoint of the bottom edge of the extruded region.

3. The semiconductor package according to claim 2, wherein the width of the extruded region of the die attach material ranges from about 5 μm to about 200 μm.

4. The semiconductor package according to claim 1, wherein a covered distance of the sidewall of the semiconductor die covered by the die attach material ranges from about 5 μm to about 200 μm.

5. The semiconductor package according to claim 1, wherein the first redistribution structure comprises a patterned conductive layer and a die attach region, the semiconductor die is disposed in the die attach region, and at least a portion of the patterned conductive layer is disposed in the die attach region.

6. The semiconductor package according to claim 5, wherein the first redistribution structure further comprises a dielectric layer disposed between the patterned conductive layer and the die attach material, and the dielectric layer comprises a concave area corresponding to the die attach region.

7. The semiconductor package according to claim 6, wherein the semiconductor die is disposed above the concave area of the dielectric layer, and the die attach material is interposed between the concave area of the dielectric layer and the semiconductor die.

8. A semiconductor package, comprising:
a first redistribution structure, comprising a dielectric layer with a recessed surface;
a semiconductor die, disposed corresponding to the recessed surface of the dielectric layer of the first redistribution structure;
a die attach material, interposed between a back surface of the semiconductor die and the recessed surface of the dielectric layer of the first redistribution structure; and
an insulating encapsulant, disposed on the first redistribution structure and covering the semiconductor die and the die attach material.

9. The semiconductor package according to claim 8, wherein a surface roughness of the recessed surface of the dielectric layer of the first redistribution structure ranges from about 1 μm to about 15 μm.

10. The semiconductor package according to claim 8, wherein an inclined interface is between the die attach material and the insulating encapsulant.

11. The semiconductor package according to claim 8, wherein a covered distance of a sidewall of the semiconductor die covered by the die attach material ranges from about 5 μm to about 200 μm.

12. The semiconductor package according to claim 8, wherein in a top view, a width of a region of the die attach material extruded from the back surface of the semiconductor die increases from an endpoint of a bottom edge of the region of the die attach material to a midpoint of the bottom edge of the region of the die attach material.

13. The semiconductor package according to claim 8, further comprising:
a through insulating via disposed aside the semiconductor die, laterally covering by the insulating encapsulant, and electrically connected to the first redistribution structure.

14. The semiconductor package according to claim 8, further comprising:
a second redistribution structure disposed on the semiconductor die and the insulating encapsulant, located opposite to the first redistribution structure, and electrically connected to the semiconductor die.

15. A semiconductor package, comprising:
a first redistribution structure;
a semiconductor die, disposed over the first redistribution structure;
a die attach material, interposed between a back surface of the semiconductor die and the first redistribution structure, a thickness of the die attach material corresponding to a central region of the back surface of the semiconductor die being greater than a thickness of the die attach material corresponding to a peripheral region of the back surface of the semiconductor die; and
an insulating encapsulant, disposed on the first redistribution structure and covering the semiconductor die and the die attach material.

16. The semiconductor package according to claim 15, wherein the central region of the back surface of the semiconductor die corresponds to a concave area of the first redistribution structure.

17. The semiconductor package according to claim 16, wherein the first redistribution structure comprises a conductive pattern and a dielectric layer disposed between the conductive pattern and the die attach material, and the concave area of the first redistribution structure corresponds to a spacing of the conductive pattern.

18. The semiconductor package according to claim 15, wherein the die attach material extends beyond the back surface of the semiconductor die and at least partially covers a sidewall of the semiconductor die.

19. The semiconductor package according to claim 18, wherein a covered distance of the sidewall of the semiconductor die covered by the die attach material ranges from about 5 μm to about 200 μm.

20. The semiconductor package according to claim 15, further comprising:
a through insulating via disposed aside the semiconductor die, laterally covering by the insulating encapsulant, and electrically connected to the first redistribution structure; and
a second redistribution structure disposed on the semiconductor die and the insulating encapsulant, located opposite to the first redistribution structure, and electrically connected to the semiconductor die.

* * * * *